(12) United States Patent
Huet et al.

(10) Patent No.: US 7,592,198 B2
(45) Date of Patent: Sep. 22, 2009

(54) METHOD FOR MAKING A PHOTOVOLTAIC CELL BASED ON THIN-FILM SILICON

(75) Inventors: Stephanie Huet, Beaulieu sur Loire (FR); Pierre Juliet, Grenoble (FR); Cedric Ducros, Bevenais (FR); Frederic Sanchette, Montferrat (FR)

(73) Assignee: Commissariat a l'Energie Atomique, Paris (FR)

( * ) Notice: Subject to any disclaimer, the term of this patent is extended or adjusted under 35 U.S.C. 154(b) by 25 days.

(21) Appl. No.: 11/908,811
(22) PCT Filed: Mar. 20, 2006
(86) PCT No.: PCT/FR2006/050239

§ 371 (c)(1),
(2), (4) Date: Sep. 17, 2007

(87) PCT Pub. No.: WO2006/100403

PCT Pub. Date: Sep. 28, 2006

(65) Prior Publication Data

US 2008/0176357 A1    Jul. 24, 2008

(30) Foreign Application Priority Data

Mar. 22, 2005   (FR) .................................. 05 50739

(51) Int. Cl.
H01L 21/20   (2006.01)
(52) U.S. Cl. ............................ 438/72; 438/97; 438/479
(58) Field of Classification Search ................. 438/57, 438/72, 96, 97, 478–487; 136/256–259; 257/E31.004
See application file for complete search history.

(56) References Cited

U.S. PATENT DOCUMENTS

| 5,501,745 | A | * | 3/1996 | Dearnaley | .................... 136/258 |
| 5,714,404 | A | | 2/1998 | Mitlitsky et al. | |
| 5,977,477 | A | * | 11/1999 | Shiozaki | .................... 136/256 |
| 6,420,647 | B1 | | 7/2002 | Ji et al. | |
| 2004/0200522 | A1 | * | 10/2004 | Fukawa et al. | ............... 136/259 |

FOREIGN PATENT DOCUMENTS

| EP | 1 100 130 | 5/2001 |
| KR | 2002 005 815 | 1/2002 |

OTHER PUBLICATIONS

Rostalsky, et al., "High rate deposition and electron beam recrystallization of silicon films for solar cells", The Solid Films, vol. 401, No. 1-2, pp. 84-87, XP004312790, 2001.
Tardy, et al., "Pulsed Electron beam annealing of sputtered amorphous Si: H films", Mat. Res. Bul., vol. 16, No. 3, pp. 347-352, XP002360123, 1981.

* cited by examiner

*Primary Examiner*—Savitri Mulpuri
(74) *Attorney, Agent, or Firm*—Oblon, Spivak, McClelland, Maier & Neustadt, L.L.P.

(57) ABSTRACT

The invention concerns a method for making a photovoltaic cell based on thin film silicon, which consists in providing a heterojunction by depositing on a support at least one first P— (or N—) doped amorphous silicon layer (13) and a second N— (or P—) doped amorphous silicon layer (14), in crystallizing, at least partly, the at least one first layer (13) using a technology for crystallizing silicon by pulsed electronic beam.

17 Claims, 2 Drawing Sheets

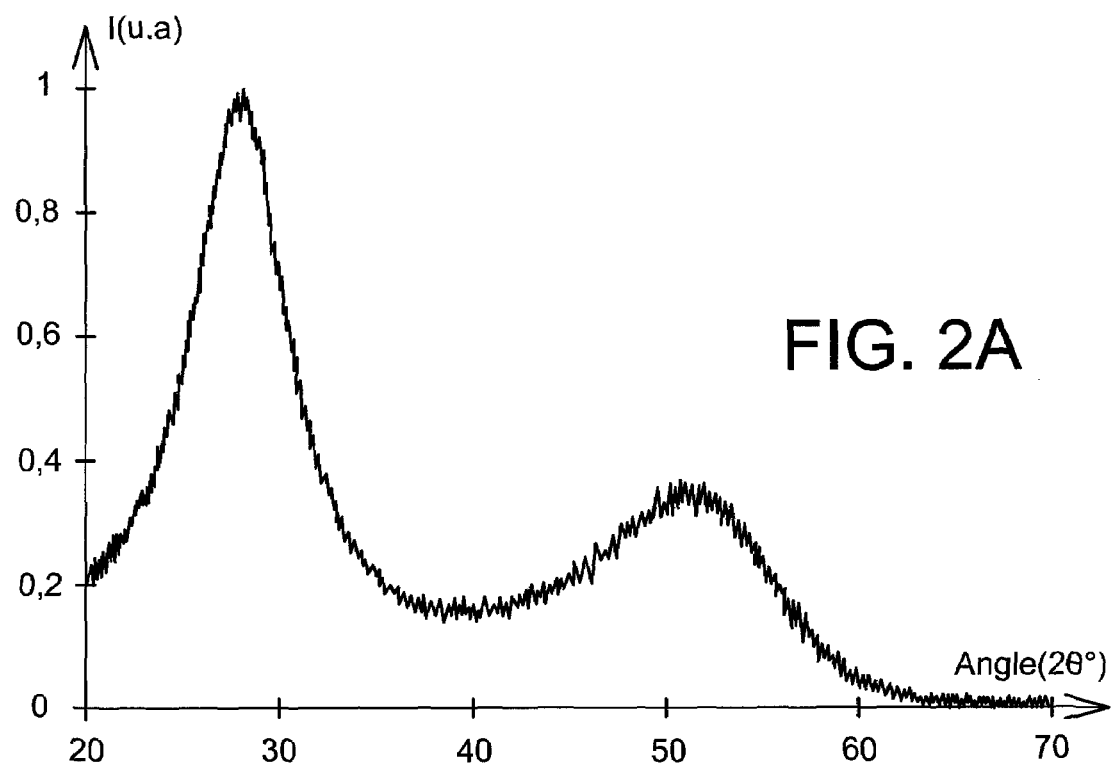
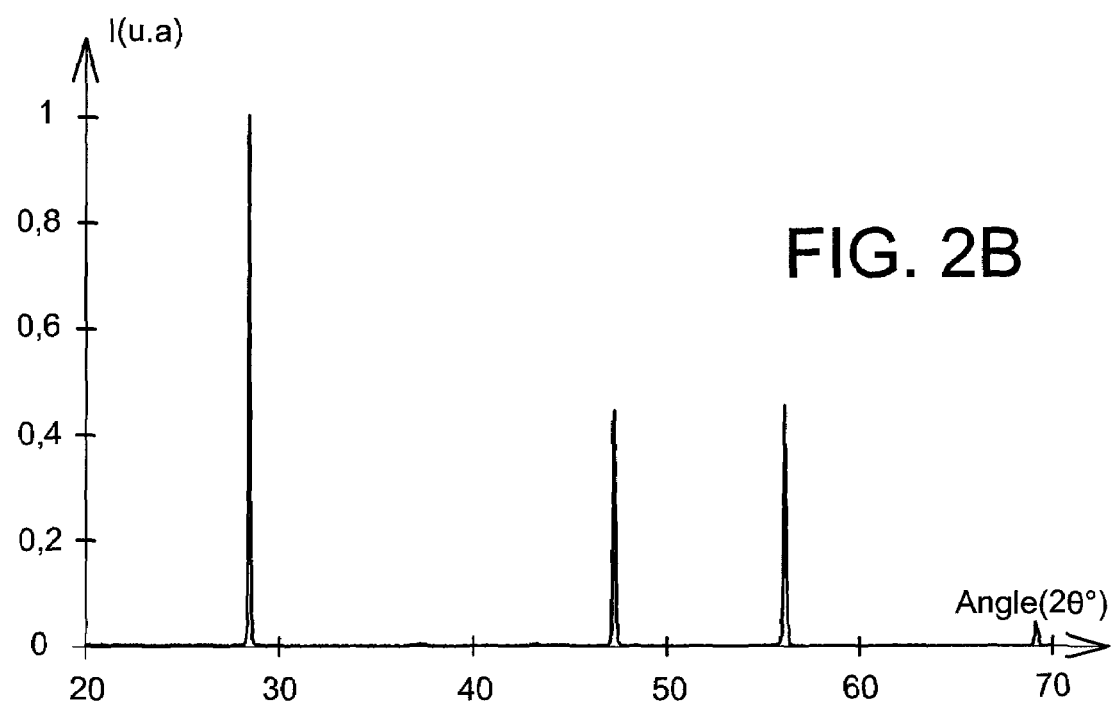

METHOD FOR MAKING A PHOTOVOLTAIC CELL BASED ON THIN-FILM SILICON

TITLE OF THE INVENTION

CROSS-REFERENCE TO RELATED APPLICATIONS

This application is the National Stage of PCT Application No. PCT/FR06/50239, filed Mar. 20, 2006. The parent application claims priority to French Application No. 0550739, filed Mar. 22, 2005. The disclosures of both applications are incorporated herein by reference in their entireties.

The invention concerns a method for making a photovoltaic cell based on thin film silicon.

BACKGROUND OF THE INVENTION

The field of the invention is that of making photovoltaic cells, which enable light to be directly converted into electricity, deposited in thin films on a support by vacuum (CVD: "Chemical Vapour Deposition" and PVD: "Physical Vapour Deposition") and "continuous" deposition methods.

The technology for making thin film photovoltaic cells, the interest of which has been shown over the last few years, concerns a type of cell (or module) obtained by depositing a thin film of semi-conductor on a support. The semi-conductor is thereby economised since it is not, as with crystalline silicon cells, sawn from a block. This technology should enable the production costs of photovoltaic cells to be significantly reduced in the future.

To use such a technology, different paths are possible:

Thin Film Crystalline Silicon

A thin film of polycrystalline silicon of 5 to 50 µm thickness is then deposited on a substrate. Such thin films should enable conversion yields of the same order as a cell on solid material to be obtained, given certain technological adaptations (optical confinement, texturing, etc.).

To carry out such a deposition, two techniques are currently possible: liquid phase epitaxy (LPE) growth, the main drawback of which is the use of a crystalline substrate and the following CVD techniques:
  the pyrolytic decomposition of silane and hydrogen on a hot tungsten filament, which enables microcrystalline silicon (µc-Si) to be deposited on a glass substrate at 500° C. at relatively high rates (greater than 0.08 µm/min),
  chemical vapour depositions (CVD) at temperatures above 800° C. in presence of a gas containing silicon (silane or chlorosilanes) and a doping gas (diborane or phosphine respectively for P— and N— doping), in which the presence of hazardous (silane) and toxic (phosphine) gases has a limitation in the long term in economic and environmental terms,
  the most common techniques, which are CVD techniques and particularly the PECVD ("Plasma Enhanced Chemical Vapour Deposition") technique, which enables silicon films to be deposited in a temperature range between 300° C. and 1200° C.

But the yields obtained with such techniques remain below 10% and only reach values of 13-16% with a recrystallisation (thermal annealing) to increase the size of the grains. Better yields are expected for crystallites of large size (above 100 µm). However the supports must be able to withstand temperatures of around 800° C. in order to recrystallise the silicon: they are for example in ceramic.

Thin Film Amorphous Silicon

Amorphous silicon, despite its disordered structure, has an absorption coefficient greater than that of crystalline silicon. However, what it gains in absorption power, it loses in electrical charge mobility (low conversion yield), with a compromise nevertheless being viable. Making amorphous silicon photovoltaic cells requires less silicon and less energy than that of crystalline silicon cells.

But with this type of inexpensive material compared to other forms of silicon, low yields (7%) are obtained. Moreover, problems of stability quickly appear when said material is exposed to sunlight and weathering. Technological artifices such as the superposition of two p-i-n structures in "tandem" or three very thin active films, may be used to offset these disadvantages. The light degradation may then be reduced from 30% to 10%.

The simplest structure of an amorphous silicon cell comprises a boron doped zone, an intrinsic zone and a phosphorous doped zone (p-i-n structure). But the industrial yields obtained have stagnated for years under the 10% bar in terms of modules.

In addition, these technologies make use of complex architectures, which affect the production cost.

Thus, the technological limitations of devices of the prior art do not enable the following objectives to be obtained:
  lifetimes greater than 20 years
  production cost of around 0.5 Euros/Wc for a yield of 13%. (Wc or watt crest being the reference that corresponds to a nominal power delivered by a photovoltaic generator under optimal operating conditions).
Indeed:
  A deposition of silicon by PECVD cannot be carried out at sufficiently fast rates (typically between 0.01 and 0.1 µm/min).
  The crystallisation of the silicon is generally achieved by thermal annealing. Technologies using an annealing by laser do not enable the depth of penetration of the laser energy to be controlled. The document referenced [1] at the end of the description describes the deposition of nanocrystalline silicon layers on graphite substrates by a PECVD method while heating the substrate. These layers are then recrystallised by means of a PEB (pulsed electron beam) crystallisation method. The presence of silicon crystals in the material before recrystallisation favours the crystallisation process. But the layers of nanocrystalline silicon have been elaborated by PECVD using hazardous and toxic gases such as trichlorosilane ($SiHCl_3$) and hydrogen, contrary to sputtering and evaporation methods. Moreover, high temperatures (between 450 and 600° C.) are necessary to obtain these crystallised silicon films.
  The optical trapping obtained by achieving an appropriate morphology of the support and the rear reflector is little developed. The texturing of the support is generally achieved by means of chemical baths, which are polluting methods characterised by slow speeds.

The aim of the present invention is to resolve the above-mentioned problems by proposing a method for making thin film photovoltaic cells (vacuum methods) based on silicon on a cheap, multifunctional support (flexible, unbreakable, excellent mechanical strength).

DETAILED DESCRIPTION OF THE INVENTION

The invention concerns a method for making a photovoltaic cell based on thin film silicon, which consists in providing a heterojunction by depositing on a support at least one first P— (or N—) doped amorphous silicon layer and a second N— (or P—) doped amorphous silicon layer, characterised in that the at least one first layer is crystallised, at least partly, using a technology for crystallising silicon by pulsed electronic beam.

Advantageously the second layer is a thin film.

Advantageously the method of the invention comprises the following steps:
  texturing of the support,
  deposition of an insulating layer,
  deposition of a reflective layer,
  deposition of at least one P— (or N—) doped amorphous silicon layer,
  crystallisation, at least partly, of this at least one amorphous silicon layer using a technology for crystallising silicon by pulsed electronic beam,
  deposition of a thin N— (or P—) doped amorphous silicon film,
  deposition of a transparent conductive oxide layer,
  deposition of a contact gate,
  if necessary, encapsulation using an atmospheric plasma coating or polymer coating technology.

Advantageously, after the reflective layer deposition step, a reflective layer texturing step may be carried out.

Advantageously, after the transparent conductive oxide layer deposition step, an antireflective layer deposition step may be carried out.

Advantageously, after this antireflective layer deposition step, a passivation layer deposition step may be carried out.

In an advantageous embodiment:
  The support is in stainless steel, in glass, in polymer, in ceramic or in a composite of several of these elements.
  The insulating layer is a layer of $SiO_x$ or $SiO_xC_yH_z$.
  The reflective layer is a metallic layer in Al, Mo or Ag or in ceramic in TiN, ZrN or $Si_3N_4$.
  The transparent conductive oxide layer is a layer of ITO, ZnO, ZnO:Al, or $SnO_2$.
  The contact gate is in aluminium, in copper, or in silver.
  The P-type dopant used to dope the amorphous silicon is aluminium, indium, gallium or boron.
  The N-type dopant used to dope the amorphous silicon is phosphorous, antimony or arsenic.
  The antireflective layer is a layer of $TiO_2$ or $Si_3N4$.

Advantageously all of the steps of the method are carried out at a temperature below 450°. The deposition of the first layer of amorphous silicon is carried out by EBPVD. The first layer has a thickness of around 10 microns. The second layer has a thickness of around a micron.

Such a method has numerous advantages:
  It uses an inexpensive support, for example in stainless steel. This is the best support for making BIPV (Building Integrated Photovoltaic) components since it has in particular very good mechanical strength and temperature resistance.
  The solution of a deposition of doped silicon by using vacuum evaporation cathodic sputtering, thermal projection or chemical vapour deposition technology (0.1 to 0.2 µm/min by sputtering with only one cathode instead of 0.01 to 0.1 µm/min by PECVD) and in the absence of toxic gas enables high deposition rates to be obtained, notably by increasing the number of cathodes.
  The technology for crystallising the silicon of the amorphous silicon layer by pulsed electronic beam constitutes a major asset for obtaining better yields compared to the technologies of the prior art, by controlling a large size of crystallites, which may typically reach several hundreds of micrometres wide and several millimetres long. This technology can be easily integrated into "continuous" equipment.
  The formation of the heterojunction on polycrystalline silicon enables the cost of the photovoltaic cell to be reduced considerably, due to the simplicity of its architecture. Unlike methods of the prior art, in which the heterojunction is formed with crystalline silicon, with the method of the invention it is formed with amorphous silicon.
  The formation of amorphous silicon layers is possible at low temperature, which is very worthwhile from a cost viewpoint (low energy expenditure and reduced equipment cost). A silicon deposition at low temperature indeed enables the use of an inexpensive multifunctional support, such as stainless steel, while respecting not only the substrate but also the layers deposited beforehand.
  The "skin pass" technology used for texturing the support is a non-polluting and quick (300 m/min) method. It enables a controlled and finer texturing of the support of around several micrometres (or microns or µm) to be achieved instead of 10 to 50 µm obtained with chemical bath methods. Moreover, an additional texturing of the rear reflector may be carried out to improve the optical trapping by a plasma etching method.

BRIEF DESCRIPTION OF DRAWINGS

FIGS. 2A and 2B illustrate the diffraction spectra of two layers of silicon respectively before and after crystallisation.

DETAILED DESCRIPTION OF SPECIFIC EMBODIMENTS

Figure 1:
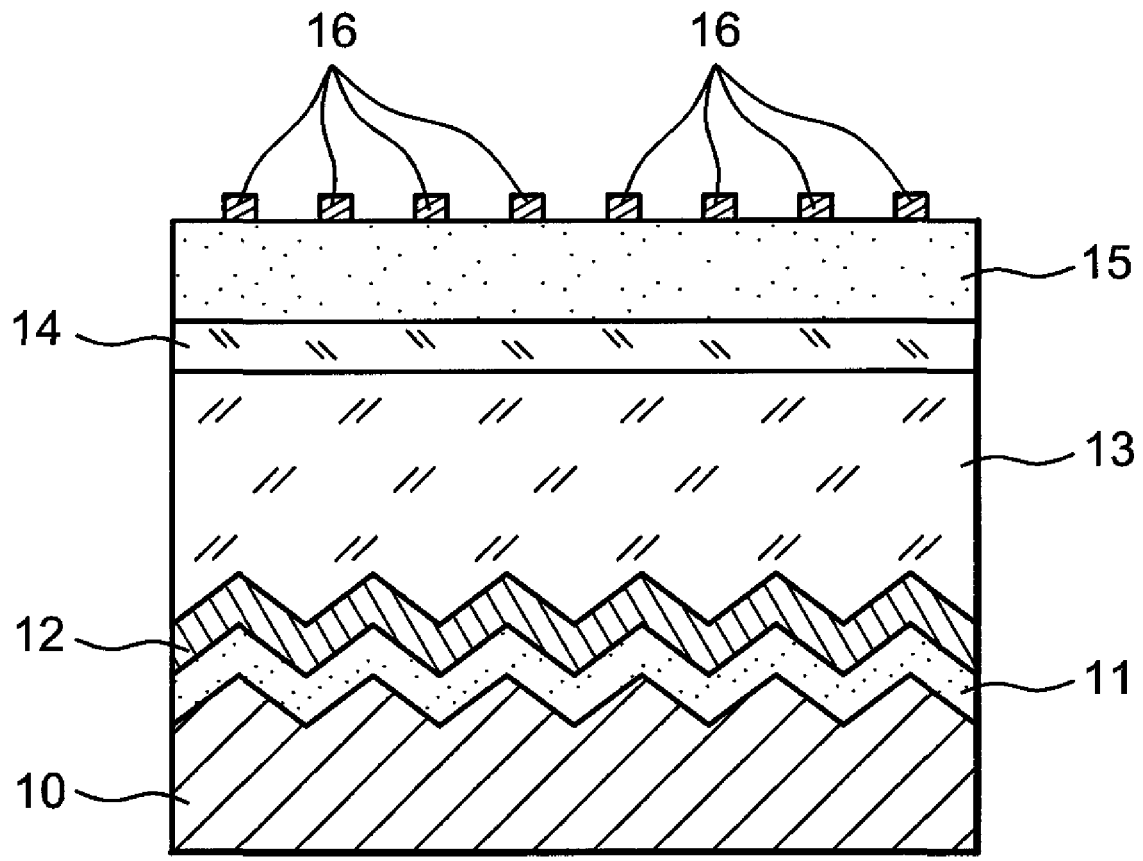
FIG. 1 illustrates a photovoltaic cell obtained with the method of the invention.

The present invention concerns a method for making photovoltaic cells based on thin film silicon comprising the formation of a PN (or NP) heterojunction composed of at least one P— (or N—) doped amorphous silicon layer at least partly crystallised by pulsed electronic beam and a N— (or P—) doped amorphous silicon layer.

The method of the invention comprises the following steps:

1) texturing of a support 10, for example in stainless steel by using a surface plastic deformation technology, for example "Skin Pass" or "IMPRINT", 2) deposition of an insulating layer 11 ($SiO_x$ or any siloxane ($SiO_2C_yH_z$) based plasma polymer such as hexamethyldisiloxane (HMDSO)), by using a chemical or physical vapour phase deposition technology, 3) deposition of a reflective layer 12 in metal (Ag, Mo, or Al) by using a technology for cathodic sputtering, or in ceramic by reactive cathodic sputtering, 4) optional texturing of this reflective layer by using for example plasma etching technology, 5) deposition of at least one first amorphous silicon layer 13, said layer being P— (or N—) doped by magnetron or evaporation technology: Advantageously, a deposition by EBPVD (Electron Beam Physical Vapour Deposition) is used. This method enables rapid deposition rates (typically around 10 nm/second, or even more) to be obtained. It is thereby possible, within industrially reasonable time limits, to deposit thick layers of material (typically around 10 microns), which enables the yield of the heterojunction to be improved. In addition, the method may be carried out at low temperature, particularly at ambient temperature.

6) crystallisation, at least partly, of this first layer 13 using a technology for crystallising silicon by pulsed electronic beam: This crystallisation method enables relatively thick (typically around 10 microns) amorphous silicon layers to be crystallised without significant heating of the substrate.

7) deposition of a second layer of amorphous silicon 14, this layer being N— (or P—) doped, by chemical of physical vapour phase deposition: the same deposition method as that of the first layer may be used. This layer typically has a thickness of around 1 micron which, associated with the crystallised layer of 10 microns, gives a good yield for the junction.

8) deposition of a transparent conductive oxide layer 15 by using a physical or chemical vapour phase deposition technology (ITO, ZnO, ZnO:Al, or $SnO_2$), 9) optional deposition of an antireflective layer by using a physical or chemical vapour phase deposition technology ($TiO_2$ or $Si_3N_4$)

10) optional deposition of a passivation layer by using a CVD technology.

11) deposition of a contact gate 16, for example in aluminium, in copper or in silver.

12) encapsulation of the whole assembly using atmospheric plasma coating or polymer coating technology.

All of the steps of the method described above may be carried out at "low temperature", typically below 450°, and even 200° C. It is therefore compatible with inexpensive substrates such as metallic or polymer based substrates, which do not withstand the temperatures commonly used in methods for making heterojunction cells.

As illustrated in FIG. 1, a cell arranged on a support 10 (leaf) in textured stainless steel is thereby obtained. This cell comprises:

- a $SiO_x$ insulating layer 11 that electrically insulates the heterojunction of the support,
- a rear reflector 12 that also serves as diffusion barrier and rear electrical contact, and which may be in aluminium (Al), in silver (Ag), in molybdenum (Mo) or titanium nitride (TiN),
- a first P— (or N—) doped amorphous silicon layer (a-Si:H) 13 crystallised, at least partly, by a pulsed electronic beam (using, for example, a P-type dopant such as: aluminium, indium, gallium, or boron),
- a second thin N— (or P—) doped amorphous silicon layer (a-Si:H) 14 (using, for example, an N— type dopant such as phosphorous, antimony, or arsenic),
- a transparent conductive oxide (TCO) contact layer 15 (for example in ITO (tin-doped indium oxide), ZnO, ZnO:Al, or $SnO_2$),
- a contact gate 16 for example in aluminium, to collect the current.

This cell may comprise a series of layers, the thicknesses of which are approximately as follows:

support 10: 125 μm
insulating layer 11: 0.5 μm
rear reflector 12: 1 μm
first amorphous silicon layer 13: 2 to 10 μm
second amorphous silicon layer 14: 10 nm
transparent conductive oxide contact 14: 1 μm.

The method of the invention is based on "thin film" technologies and on the use of crystalline silicon. The heterojunction formed by the layer 13-layer 14 junction is a simple architecture that enables both the manufacturing cost and the problems of integrating the different layers making up the cell to be limited (unlike tandem or triple p-i-n junctions). The technology for crystallisation by pulsed electronic beam constitutes a major advantage for the controlled treatment of thin films. It enables the silicon layer to be quickly and precisely crystallised by controlling the penetration depth of the electrons in the material and their energy (typically 10 eV/nm), which is not possible when using conventional recrystallisation techniques such as laser or heat technology. It enables inexpensive supports to be used while respecting the nature of the supports and the previously deposited layers (insulating layer and rear reflector), unlike the techniques of the prior art (heat or laser treatment), which impose supports that withstand high temperatures such as ceramics, and costly equipment enabling these temperatures to be withstood.

Embodiment

In FIGS. 2A and 2B are represented the X-ray diffraction spectra of a silicon layer respectively before and after crystallisation by pulsed electronic beam.

The diffraction spectrum obtained before crystallisation is typical of that of an amorphous silicon a-Si:H. The principal peak (ray 111) has a mid-height width of around 10°.

On the other hand, the diffraction spectrum obtained after crystallisation by pulsed electronic beam is typical of a crystallised layer. The diffraction spectrum shows the characteristic peaks of rays (111), (220) and (311). In particular, the principal peak (111) has a mid-height width of around 0.05 to 1°, which demonstrates the crystalline quality of the silicon layer after crystallisation by beam of electrons.

The parameters of the pulsed electronic beam used for the recrystallisation of the silicon may be as follows: electron energy 50-400 keV, beam current 200-500 A, cross section of beam 50-100 $cm^2$; pulse duration from 5 to 250 μs, maximum power density on the target 6 MW/$cm^2$, maximum energy density 500 J/$cm^2$, all of these parameters being controlled independently.

REFERENCE

[1] "High rate deposition and electron beam recrystallization of silicon films for solar cells", by M. Rostalsky and J. Müller (Thin Solid Films 401, 2001, pages 84-87).

The invention claimed is:

1. A method for making a photovoltaic cell, comprising:

texturing a surface of an inexpensive, multifunctional support;

depositing an insulating layer by chemical or physical vapour phase technology on the textured surface of the support;

depositing a reflective layer on the deposited insulating layer;

depositing at least one first doped amorphous silicon layer by Electron Beam Physical Vapour Deposition on the deposited reflective layer;

crystallizing at least a part of the deposited first amorphous doped silicon layer by pulsed electronic beam technology;

forming a heterojunction by depositing a second doped amorphous silicon layer on the at least partly crystallized at least one first doped amorphous silicon layer by chemical or physical vapour phase technology;

depositing a transparent conductive oxide layer on the deposited second doped amorphous silicon layer by chemical or physical vapour phase technology;

depositing a contact gate on the deposited transparent conductive oxide layer to form an assembly comprising the support, the reflective layer, the at least partly crystallized at least one first doped silicon layer, the second doped silicon layer, the transparent conductive oxide layer and the contact gate;

encapsulating the formed assembly by atmospheric plasma coating or polymer coating technology;

wherein if the at least one doped first amorphous silicon layer contains a P-dopant, the second doped amorphous doped silicon layer contains a N-dopant and if the at least one doped first amorphous silicon layer contains a N-dopant, the second doped amorphous doped silicon layer contains a P-dopant, the inexpensive multifunctional support is a metallic or polymeric substrate, and the depositing a reflective layer is depositing a metal reflective layer by cathodic sputtering or depositing a ceramic reflective layer by reactive cathodic sputtering.

2. The method according to claim 1, wherein the second doped amorphous silicon layer is a thin film.

3. The method according to claim 1, further comprising, after the depositing a reflective layer, texturing said reflective layer.

4. The method according to claim 1, further comprising, after the depositing a transparent conductive oxide layer, depositing an antireflective layer on the deposited transparent conductive oxide layer.

5. The method according to claim 4, further comprising, after the depositing an antireflective layer, depositing a passivation layer on the deposited antireflective layer.

6. The method according to claim 1, wherein the inexpensive multifunctional support is one selected from the group consisting of stainless steel a metal, a glass, a polymer, a ceramic and a composite of thereof.

7. The method according to claim 1, wherein the insulating layer comprises $SiO_x$ or $SiO_xC_yH_z$.

8. The method according to claim 1, wherein the reflective layer is a metallic reflective layer selected from the group consisting of Al, Mo and Ag.

9. The method according to claim 1, wherein the reflective layer is a ceramic reflective layer selected from the group consisting of TiN, ZrN and $Si_3N_4$.

10. The method according to claim 1, wherein the transparent conductive oxide layer is a layer selected from the group consisting of ITO, ZnO, ZnO:Al, and $SnO_2$.

11. The method according to claim 1, wherein the contact gate is selected from the group consisting of aluminium, copper and silver.

12. The method according to claim 1, wherein the P-dopant is selected from the group consisting of aluminium, indium, gallium and boron.

13. The method according to claim 1, wherein the N-dopant is selected from the group consisting of phosphorous, antimony and arsenic.

14. The method according to claim 4, wherein the antireflective layer is $TiO_2$ or $Si_3N_4$.

15. The method according to claim 1, wherein a temperature is below 450° C.

16. The method according to claim 1, wherein a thickness of the at least one first doped amorphous silicon layer is in the range of from 2 to 10 microns.

17. The method according to claim 1, wherein a thickness of the second doped amorphous Si layer is approximately one micron.

* * * * *